United States Patent [19]

Tohrin et al.

[11] Patent Number: 4,738,890

[45] Date of Patent: Apr. 19, 1988

[54] RESIN-IMPREGNATED BASE AND METHOD OF MANUFACTURING SAME

[75] Inventors: Yasuo Tohrin; Tokio Yoshimitsu; Hideto Misawa; Motoyuki Akamatsu, all of Kadoma, Japan

[73] Assignee: Matsushita Electric Works, Ltd., Osaka, Japan

[21] Appl. No.: 789,159

[22] Filed: Oct. 18, 1985

[30] Foreign Application Priority Data

Apr. 13, 1985 [JP] Japan ................... 60-78711
Apr. 13, 1985 [JP] Japan ................... 60-78712
Apr. 13, 1985 [JP] Japan ................... 60-78713

[51] Int. Cl.$^4$ .............................. B32B 3/00
[52] U.S. Cl. .................... 328/196; 428/195; 428/246; 428/251; 428/273; 428/417; 428/901
[58] Field of Search ........ 428/195, 901, 196, 413–418, 428/273, 290, 251, 246

[56] References Cited

U.S. PATENT DOCUMENTS

| 4,515,848 | 5/1985 | Leunig | 428/290 |
| 4,539,252 | 9/1985 | Franz | 428/290 |

FOREIGN PATENT DOCUMENTS

| 13244 | 8/1980 | European Pat. Off. . |
| 91769 | 9/1983 | European Pat. Off. . |
| 5538274 | 5/1976 | Japan . |
| 787674 | 12/1957 | United Kingdom . |
| 926037 | 12/1958 | United Kingdom . |
| 830335 | 3/1960 | United Kingdom . |
| 948915 | 2/1964 | United Kingdom . |
| 1004447 | 9/1965 | United Kingdom . |
| 1062499 | 3/1967 | United Kingdom . |
| 1163315 | 5/1969 | United Kingdom . |
| 1214669 | 12/1970 | United Kingdom . |
| 1252723 | 11/1971 | United Kingdom . |
| 1297103 | 11/1972 | United Kingdom . |
| 1308947 | 3/1973 | United Kingdom . |
| 1416392 | 12/1975 | United Kingdom . |
| 1462787 | 1/1977 | United Kingdom . |
| 1513765 | 6/1978 | United Kingdom . |
| 2041420 | 9/1980 | United Kingdom . |
| 2104930 | 3/1983 | United Kingdom . |

*Primary Examiner*—James J. Bell
*Attorney, Agent, or Firm*—Burns, Doane, Swecker & Mathis

[57] ABSTRACT

A resin-impregnated base of which total quantity of resin absence regions is restricted to be below a predetermined value, whereby a metal-foil coated laminate of the resin-impregnated bases is made obtainable continuously through a hot-compression molding under a low pressure, while restraining in particular void generation to maintain the dimensional change rate of the laminate to be minimum.

10 Claims, No Drawings

RESIN-IMPREGNATED BASE AND METHOD OF MANUFACTURING SAME

TECHNICAL BACKGROUND OF THE INVENTION

This invention relates generally to resin-impregnated bases and methods of manufacturing such bases and, more particularly, to a resin-impregnated base which is moldable under a low pressure and excellent in the thermal properties and a method of manufacturing the same.

The resin-impregnated base of the type referred to is effectively utilized in making a laminate by stacking and molding a plurality of the resin-impregnated bases together with a metal foil, or in making a multi-ply printed-wiring board of the resin-impregnated bases laminated with an interior circuit board or boards, or with multilayering metal-foil coated laminates or the like.

DISCLOSURE OF PRIOR ART

Hitherto, the resin-impregnated base of this kind has been prepared by impregnating such a base as a glass cloth or the like with a varnish of such thermosetting resin as epoxy resin, phenolic resin or the like, and drying it through a proper dryer or the like.

A plurality of the thus prepared resin-impregnated bases are stacked and hot-compression molded with a metal foil placed on the topmost layer of the bases so that the metal-foil coated laminate for use in the printed-wiring board or the like can be obtained. An example of the resin-impregnated base of this kind has been disclosed in Japanese Patent Publication No. 55-38274.

In such resin-impregnated base, on the other hand, air bubbles contained reach 1,000 to 6,000 or, in some occasions, even 50,000 to 100,000 per square inch, and it has been required to perform the hot-compression molding for the lamination under a considerably high pressure in order to eliminate generation of void. In this case, however, there have arisen such problems that the high pressure molding is not adaptable to a series production of the laminates so as to remain low in the productivity, and the rate of dimensional change of the resultant laminate is increased due to the high pressure imposed so that, in the case of, for example, the printed-wiring board made with the metal-foil coated laminates, printed circuits on the laminates may easily be caused to be deviated from predetermined positions. Further problem caused by the high pressure applied during the molding has been a reduction in resin amount at the boundary between the resin-impregnated base and the metal foil, which deteriorating the resistance to dampness.

TECHNICAL FIELD OF THE INVENTION

A primary object of the present invention is, therefore, to provide a resin-impregnated base and a method of manufacturing the same, which base is moldable through a low pressure hot-compression in making such molded products as metal-foil coated laminate and the like for their adaption to a series molding to improve the productivity, and is still high both in the dimensional stability and resistance to dampness.

According to the present invention, this object can be achieved by providing a resin-impregnated base and its manufacturing method, the base being prepared by impregnating a base with a resin varnish and drying it, wherein the quantity of resin absence regions in the resin-impregnated base is below a predetermined value.

With such a measure according to the present invention, generation of void is sufficiently restrained during the hot-compression molding of a plurality of the resin-impregnated bases stacked, for allowing them to be subjected to a low pressure series molding so that, in the metal-foil coated laminate and the like products molded under the low pressure, an optimum amount of resin can be retained at the boundary between the resin-impregnated base and the metal foil and the products can be provided with a high resistance to dampness.

Other object and advantages of the present invention shall become clear from the following description of the invention detailed with reference to preferred working examples of the invention.

While the present invention shall now be described with reference to the preferred examples, it should be understood that the intention is not to limit the invention only to the particular examples but rather to cover all alterations, modifications and equivalent arrangements possible within the scope of appended claims.

DISCLOSURE OF PREFERRED EMBODIMENTS

Noticing that the respective foregoing problems in the known resin-impregnated bases have arisen when the air bubbles or regions where fibrous material of such base as the glass cloth is not impregnated with the thermosetting resin, that is, resin absence regions, are large in the quantity in the resin-impregnated base prepared through the impregnation, the basis of the present invention has been placed on such idea of providing a resin-impregnated base which is low in the total quantity of the resin absence regions (the air bubbles or non resin-impregnated spots).

According to a first feature of the present invention, there is provided a resin-impregnated base in which the total area of the resin absence regions is below 0.3% of the overall area of the base. More in detail, a glass cloth, a cloth of nylon, Tetoron (a polyester resin product by TOYO RAYON and TEIJIN) and the like, an unwoven cloth, paper of the like is used as the base, which is impregnated with any one of generally employed varnishes of polyimide, polyester, epoxy and the like resins as the thermosetting resin varnish with an application and removal of a pressure during the impregnation, the impregnated resin is dried, and the resin-impregnated base is obtained.

It will be appreciated that the percentage of the resin absence regions can be determined by means of, for example, well known whiteness or optical transmission detection or X-ray image. Further, it is preferable in particular to obtain the total area of the resin absence regions by, for example, adding the number of air bubbles multiplied by the average area of the air bubbles to the average area of the non resin-impregnated spots in the fiber multiplied by the number of such spots.

It has been found that a metal-foil coated laminate obtained from a plurality of the resin-impregnated bases which are less than 0.3% in the total resin absence area and are laminated as hot-compression molded under a low pressure, exhibits no void generation and is excellent in the resistance to heat and dampness as well as in the electrical insulating properties.

Further, it has been also found that, in selecting the resin-impregnated bases less than 0.3% in the total resin absence area as measured by the whiteness or optical transmission detecting, the thickness of the resin-impregnated base should optimumly be in a range of 0.10 to 0.30 mm, because the whiteness or optical transmission becomes too high when the thickness is smaller than 0.10 mm and too low with the thickness larger than 0.30 mm so as to render any significant difference between the resin absence regions and other regions to be small.

Examples in which the present invention is worked and their comparison with comparative examples equivalent to known art are as follows.

EXAMPLE 1

A glass cloth of 0.15 mm thick and 1050 mm wide was immersed in an impregnating resin varnish bath of a brominated epoxy resin in a resin content of 65 wt% and containing a curing agent, pressed by means of rolls and released therefrom while being immersed to impregnate the cloth uniformly with the varnish to be 45 wt% to resin pickup, and then dried to obtain a resin-impregnated base. Eight of the thus obtained resin-impregnated bases were stacked and hot-compression molded under the conditions of 30 Kg/cm$^2$ and 170° C. for 90 minutes to form a laminate.

EXAMPLE 2

A glass cloth of 0.20 mm thick and 1050 mm wide was immersed in the impregnating bath of the same epoxy resin varnish as in Example 1, the bath was kept in a subatmospheric pressure state of 50 Torr for 2 minutes and thereafter restored to the atmospheric pressure state to impregnate the cloth uniformly with the varnish to be of 45 wt% resin pickup, the cloth was taken out of the bath and dried, and a resin-impregnated base was obtained. A laminate of the thus obtained resin-impregnated bases was obtained under the same conditions as in Example 1.

COMPARATIVE EXAMPLE 1

A resin-impregnated base was obtained in the same manner as in Example 1, except for omission of the roll pressing and releasing in the bath, and a laminate was obtained in the same manner as in Example 1.

COMPARATIVE EXAMPLE 2

A resin-impregnated base was obtained in the same manner as in Example 1 except that a base of 0.40 mm thick was used, and a laminate was obtained in the same manner as in Example 1.

Comparison measurements for the products of Examples 1 and 2 and Comparative Examples 1 and 2 are as in the following Table I:

TABLE I

|  | EXAMPLES | | COMPARATIVE EXAMPLES | |
|---|---|---|---|---|
|  | 1 | 2 | 1 | 2 |
| Resin absence region (%) in resin-impregnated base | 0.10 | 0.02 | 0.5 | 0.4 |
| Heat resistance (°C.) of laminate | 260 | 265 | 245 | 245 |
| Heat resistance (minute) after moistened of laminate - A* | 200 | 200 | 100 | 120 |
| Heat resistance (minute) after moistened of laminate - B* | 3 and above | 3 and above | 1–2 | 1–2 |
| Voids in laminate after moistened | absent | absent | present | present |

*The heat resistance "A" is of the laminate moistened by dipping it in boiling water for 4 hours and then placing on melt solder of 260° C., and the heat resistance "B" is of the laminate similarly moistened but dipped in the melt solder also of 260° C.

It will be appreciated in view of the above comparison measurements of Table I that the laminate prepared with the resin-impregnated bases according to the present invention exhibits no presence of void and thus excellent heat resisting properties.

According to a second feature of the present invention, there is provided a resin-impregnated base in which the number of air bubbles forming a part of the resin absence regions is made less than 500 pcs/in$^2$. More particularly, the base may be not only one of the cloths mentioned in connection with the first feature, but also of paper of nonwoven fabrics including the one of asbestos or any other inorganic fibers alone or their textile blend, and the varnish may be not only such thermosetting resin varnishes of the first feature, but also of such thermoplastic resin as polyimide, polyphenylene polysulfide resin, polyamide resin or the like. In impregnating the base with the resin varnish as dipped in the impregnating bath, the base is subjected to a subatmospheric pressure, or to the same roll pressing and releasing as in the case of the first feature, that is, as passed between two upper and lower nip rolls disposed within the varnish bath. In practice, the base is pressed through the nip rolls disposed in three stages under a pressure of 10 Kg/cm$^2$, the resin pickup is thereby made to be 35 to 65 wt% in solid content, the base is then dried at a temperature of 100° to 160° C., and a resin-impregnated base containing air bubbles of less than 500 pcs/in$^2$ is obtained.

A predetermined number of such resin-impregnated bases are stacked with a metal foil disposed on one or both surfaces of the stacked bases, which are held between two upper and lower moving belts under a pressure of, for example, 10 to 30 Kg/cm$^2$ and at a temperature of 150° to 170° C. to be sequentially hot-compression molded, and a metal-foil coated laminate is obtained. In this case, the metal foil may be of copper, aluminum, brass, nickel, stainless steel, iron or the like. It may be also possible to obtain the metal-foil coated laminate by disposing a plurality of sets of the stacked resin-impregnated bases respectively between two metal sheets and holding them between opposed platens to subject them to a hot-compression molding under the conditions of 10 to 30 Kg/cm$^2$ and 150° to 170° C. for 40 to 90 minutes.

Examples performing the invention of this second feature and comparative examples equivalent to known art are as follows:

EXAMPLE 3

A glass cloth of 0.20 mm thick and 1050 mm wide was immersed in an impregnating resin varnish bath of an epoxy resin in a resin content of 70 wt% and containing a curing agent, pressed as passed between nip rolls under 10 Kg/cm$^2$ and released therefrom to impregnate the cloth uniformly with the varnish to be of 45 wt% resin pickup, and then dried to obtain a resin-impregnated base. Six of the thus obtained resin-impregnated bases were stacked, a copper foil of 0.035 mm thick was placed on each of the top and bottom of the stack, they were held in a set between two upper and lower moving belts to be continuously hot-compression molded under the conditions of 20 Kg/cm$^2$ and 170° C., and a copper-foil coated laminate was obtained. Modifying the hot-compression molding pressure to be 15 Kg/cm$^2$, further, a 4-ply printed wiring board was prepared substantially in the same manner as in the preparation of the copper-foil coated laminate.

EXAMPLE 4

A resin-impregnated base was obtained in the same manner as in Example 3, except that the resin varnish impregnation was carried out for 5 minutes under a vacuum with the varnish bath so drawn, and a 4-ply printed wiring board was obtained in the same manner as in Example 3.

EXAMPLE 5

A resin-impregnated base of 45 wt% resin pickup was obtained in the same manner as in Example 4 except for the use of an impregnating resin varnish available as Kelimide (a product of RHONE POULENC) of 58 wt% resin content, and the copper-foil coated laminate as well as the 4-ply printed wiring board were prepared in the same manner as in Example 3.

COMPARATIVE EXAMPLE 3

A resin-impregnated base was obtained in the same manner as in Example 3 except that the cloth was not pressed in the varnish bath for the resin impregnation, and the copper-foil coated laminate as well as the 4-ply printed board were obtained in the same manner as in Example 3.

COMPARATIVE EXAMPLE 4

A resin-impregnated base was obtained in the same manner in Example 5 except that the varnish bath was not drawn to the vacuum during the resin impregnation, and the copper-foil coated laminate and 4-ply printed wiring board were obtained in the same manner as in Example 3.

COMPARATIVE EXAMPLE 5

A resin-impregnated base was obtained in the same manner as in Comparative Example 3, and a laminate was obtained by stacking six of such resin-impregnated bases, placing copper foils of 0.035 mm thick on the top and bottom of the stack, and subjecting them in a set to a hot-compression molding under the conditions of 50 Kg/cm$^2$ and 170° C. for 60 minutes. A 4-ply printed wiring board was obtained through the same hot-compression molding of 50 Kg/cm$^2$ and 170° C. for 60 minutes.

Following Table II shows comparison measurements for the products of Examples 3, 4 and 5 and Comparative Examples 3, 4 and 5:

TABLE II

| | EXAMPLES | | | COMPARATIVE EXAMPLES | | |
|---|---|---|---|---|---|---|
| | 3 | 4 | 5 | 3 | 4 | 5 |
| Number of air bubbles (pcs/in$^2$) in resin-impregnated base | 487 | 23 | 7 | 8,000 | 8,000 | 800 |
| Number of voids in laminate | 1 | 0 | 0 | 80 | 40 | 7 |
| Dimensional change rate ($\mu$m) of laminate* | 50 | 49 | 53 | 80 | 150 | 200 |
| Penetration degree ($\mu$m) of plating solution into laminate** | 50 | 60 | 72 | 300 | 150 | 100 |

*The dimensional change rate was measured in 500 mm span.
**The penetration degree of plating solution was measured by drilling the laminate.

It will be appreciated in view of the comparison measurements of Table II that the laminate prepared by using the resin-impregnated base according to the present invention exhibits substantially no presence of void and is excellent in particular in the degree of penetration.

According to a third feature of the present invention, there is provided a resin-impregnated base of which the number of air bubbles in the resin absence regions per inch$^2$ in made less than 500, and to which a metal foil is bonded through a resin layer applied onto one surface of the foil. While the same material as in the second feature may be used for the base, a glass cloth preferably of 0.10 to 0.30 mm thick and 100 to 300 g/m$^2$ in weight is employed together with the same impregnating resin varnish as in the second feature, and the resin-impregnated base is obtained in the same manner as in the second feature.

The metal-foil coated laminate is made obtainable in the same manner as in the second feature, using also the same metal foil, except that a metal foil having a resin layer applied onto a surface of the side to be bonded to a stack of the resin-impregnated bases is employed. In this case, the resin layer may be of the same material as the resin varnish, but its weight is set to be in a range of 5 to 100 g/m$^2$ since it has been found that a value less than 5 g/m$^2$ reaches only an unfavourable result. When in particular the metal foil has an uneven surface, it is preferable to set the value on the basis of the thinnest parts of the resin layer applied onto raised portions of the uneven metal foil.

Examples according to the third feature of the present invention and their comparative examples are as follows:

EXAMPLE 6

A resin-impregnated base was obtained in the same manner as in Example 3 except that the weight of the glass cloth base was selected to be 200 g/m$^2$. Further, eight of such impregnated bases were stacked, a copper foil of 0.035 mm thick and having a layer of epoxy resin applied to be of a weight of 25 g/m$^2$ was placed on the top of the stack of the resin-impregnated bases with the resin layer opposed thereto, the stack and metal foil were held in a set between two upper and lower moving belts to be hot-compression molded continuously under the conditions of 15 Kg/cm$^2$ and 170° C., and a copper-fold coated laminate of 1.6 mm thick was obtained.

EXAMPLE 7

A resin-impregnated base was obtained in the same manner as in Example 6 except that the glass cloth was immersed in the varnish bath kept under a vacuum for the resin impregnation, and a copper-foil coated laminate was obtained in the same manner as in Example 6 except that the resin layer on the copper foil was made to be 20 g/m².

EXAMPLE 8

A resin-impregnated base was obtained in the same manner as in Example 7 except that a glass cloth of a weight of 150 g/m², and an impregnating bath of polyimide resin of 58 wt% in resin content were used, and that the impregnation was made to be 50 wt% in resin pickup. With the impregnated bases thus obtained, a copper-foil coated laminate was obtained in the same manner as in Example 6.

COMPARATIVE EXAMPLE 6

A resin-impregnated base was obtained in the same manner as in Example 6 except for the use of a copper foil having no resin layer, and a copper-foil coated laminate was obtained in the same manner as in Example 6.

COMPARATIVE EXAMPLE 7

A copper-foil coated laminate of 1.6 mm thick was obtained by stacking eight of the resin-impregnated bases, placing a copper foil of 0.035 mm thick on the top of the stacked bases, and subjecting them to a hot-compression molding as held between platens and under the conditions of 50 Kg/cm² and 170° C. for 60 minutes.

Comparative measurements of the products according to Examples 6 to 8 and Comparative Examples 6 and 7 are as shown in the following Table III:

TABLE III

|  | EXAMPLES | | | COMPARATIVE EXAMPLES | |
|---|---|---|---|---|---|
|  | 6 | 7 | 8 | 6 | 7 |
| Number of air bubbles (pcs/in²) in resin-impregnated base | 487 | 23 | 7 | 487 | 487 |
| Number of voids in laminate | 1 | 0 | 0 | 80 | 40 |
| Dimensional change rate (μm) of laminate* | 50 | 49 | 53 | 80 | 200 |
| Thickness tolerance (mm) of laminate | 0.03 | 0.02 | 0.04 | 0.09 | 0.1 |
| Penetrating degree (μm) of plating solution into laminate** | 50 | 60 | 72 | 300 | 150 |
| Dampness resistance (h) of laminate | 4 | 4.5 | 4 | 2 | 2 |
| Copper-foil roughness (μm) of laminate | 1.5 | 2 | 2 | 3 | 3 |

*The dimensional change rate was measured in 500 mm span.
**The penetrating degree was measured by drilling the laminate.

It will be appreciated in view of Table III that the laminates of the invention have been effectively improved in various factors required for the laminates of the kind referred to.

According to a fourth feature of the present invention, there is obtained a resin-impregnated base by impregnating a glass cloth base of 0.10 to 0.30 mm thick and 100 to 300 g/m² in weight with a thermosetting resin and drying them. The resin-impregnated base as well as the metal-foil coated laminate are obtained as processed substantially in the same manner as in the second feature of the present invention except for the particular base cloth and impregnating resin materials.

Working examples and their comparative data according to this fourth feature of the present invention will be substantially the same as those referred to in connection with the third feature.

Further, according to a fifth feature of the present invention, the hot-compression molding of the resin impregnated base prepared by any one of the foregoing features for obtaining the metal-foil coated laminate is performed specifically under a relatively under a low pressure of 1 to 40 Kg/cm². Working examples according to this fifth feature and their comparative data are substantially the same as those explained in connection with the first to fourth features. In particular, a remarkable improvement in the rate of dimensional change is achieved, so that the circuit parts in the printed wiring board made from the metal-foil coated laminate can be reliably prevented from being deviated from their predetermined positions during the hot-compression molding.

What is claimed as our invention is:

1. A resin-impregnated base comprising a base and a resin varnish impregnated and dried in said base, wherein said resin-impregnated base has resin absence regions comprising air bubbles, non-resin-impregnated portions, or mixtures thereof, and wherein the total area of said resin absence regions is less than 0.3% of the overall area of said resin-impregnated base.

2. A resin-impregnated base according to claim 1, wherein the number of air bubbles of said resin absence regions is less than 500 pcs/in².

3. A resin-impregnated base according to claim 1, wherein said base is of a glass cloth having a thickness of 0.10 to 0.30 mm and a weight of 100 to 300 g/m².

4. A metal-foil laminate comprising a laminate of stacked resin-impregnated bases according to claim 1 with metal foil disposed on one or both surfaces of said stacked bases and wherein said metal foil is bonded through a resin layer to said stacked resin-impregnated bases.

5. A laminate according to claim 4, wherein said resin layer is provided to be 5 to 100 g/m² in weight.

6. A laminate comprising a plurality of stacked resin-impregnated bases respectively of a base and a resin varnish impregnated and dried in said base, wherein said resin-impregnated bases have respectively resin absence regions the total area of which is less than 0.3% of the overall area of said base, and said stacked resin-impregnated bases are joined as hot-compression molded under a pressure of 1 to 40 Kg/cm².

7. A method of manufacturing a resin-impregnated base comprising the steps of impregnating a base with resin varnish, and drying said base after said impregnating step, wherein said resin-impregnated base has resin absence regions comprising air bubbles, non-resin-impregnated portions, or mixtures thereof, and wherein the total area of said resin absence regions is made to be less than 0.3% of the overall area of the base at the impregnating step.

8. A method according to claim 7, wherein said impregnating step includes an immersing of said base in a resin varnish bath and a pressing of the base in said bath.

9. A method according to claim 8, wherein said impregnating step further includes a releasing within said bath of said pressing.

10. A method according to claim 7, wherein said impregnating step includes an immersing of said base in a resin varnish bath kept under a vacuum.

* * * * *